(12) United States Patent
Natori et al.

(10) Patent No.: US 12,507,413 B2
(45) Date of Patent: Dec. 23, 2025

(54) SEMICONDUCTOR DEVICE, SEMICONDUCTOR DEVICE MANUFACTURING METHOD, AND SEMICONDUCTOR DEVICE MANUFACTURING APPARATUS

(71) Applicant: Kioxia Corporation, Tokyo (JP)

(72) Inventors: Katsuaki Natori, Mie (JP); Hiroshi Toyoda, Mie (JP); Masayuki Kitamura, Mie (JP); Takayuki Beppu, Mie (JP); Koji Yamakawa, Mie (JP); Kenichiro Toratani, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 18/343,176

(22) Filed: Jun. 28, 2023

(65) Prior Publication Data

US 2024/0130125 A1 Apr. 18, 2024

Related U.S. Application Data

(62) Division of application No. 17/004,251, filed on Aug. 27, 2020, now abandoned.

(30) Foreign Application Priority Data

Mar. 24, 2020 (JP) .................................. 2020-052042

(51) Int. Cl.
*H10B 43/27* (2023.01)
*C23C 16/06* (2006.01)
(Continued)

(52) U.S. Cl.
CPC .............. *H10B 43/27* (2023.02); *C23C 16/06* (2013.01); *C23C 16/56* (2013.01); *H01L 21/28* (2013.01)

(58) Field of Classification Search
CPC .............. H01L 27/1225; H01L 29/7869; H01L 27/124; H01L 29/78648; H01L 29/78696
See application file for complete search history.

(56) References Cited

U.S. PATENT DOCUMENTS

| 5,366,590 A | 11/1994 | Kadomura |
|---|---|---|
| 7,794,616 B2 | 9/2010 | Honda et al. |

(Continued)

FOREIGN PATENT DOCUMENTS

| JP | 5242140 B2 | 7/2013 |
|---|---|---|
| JP | 5554779 B2 | 7/2014 |

(Continued)

OTHER PUBLICATIONS

Massalski et al., "Binary Alloy Phase Diagrams Second Edition," The Materials Ingormation Society, Jul. 2001, vol. 3,Pages (6 total).

*Primary Examiner* — Tony Tran
(74) *Attorney, Agent, or Firm* — Foley & Lardner LLP

(57) ABSTRACT

A semiconductor device includes a conductive film containing molybdenum and a metal element. The metal element has a melting point lower than the melting point of molybdenum and forms a complete solid solution with molybdenum. The metal element as a material for composing the conductive film is at least one selected from the group consisting of, for example, titanium, vanadium, and niobium.

3 Claims, 10 Drawing Sheets

(51) Int. Cl.
    *C23C 16/56*     (2006.01)
    *H01L 21/28*     (2006.01)

(56) References Cited

U.S. PATENT DOCUMENTS

| | | |
|---|---|---|
| 9,620,366 B2 | 4/2017 | Nakao et al. |
| 10,170,494 B2 | 1/2019 | Ishizaki et al. |
| 2016/0225866 A1 | 8/2016 | Peri et al. |
| 2019/0259621 A1 | 8/2019 | Natori et al. |
| 2020/0091080 A1 | 3/2020 | Wakatsuki et al. |
| 2020/0176473 A1 | 6/2020 | Yamazaki et al. |
| 2020/0403070 A1* | 12/2020 | Matsuda ............. H01L 29/7806 |

FOREIGN PATENT DOCUMENTS

| | | |
|---|---|---|
| JP | 2015-110827 A | 6/2015 |
| JP | 2017-098428 A | 6/2017 |

* cited by examiner

SEMICONDUCTOR DEVICE, SEMICONDUCTOR DEVICE MANUFACTURING METHOD, AND SEMICONDUCTOR DEVICE MANUFACTURING APPARATUS

CROSS-REFERENCE TO RELATED APPLICATION(S)

This application is a division of U.S. application Ser. No. 17/004,251, filed on Aug. 27, 2020, which is based upon and claims the benefit of priority from Japanese Patent Application No. 2020-052042, filed Mar. 24, 2020, the entire contents of which are incorporated herein by reference.

FIELD

Embodiments described herein relate generally to a semiconductor device, a semiconductor device manufacturing method, and a semiconductor device manufacturing apparatus.

BACKGROUND

Three-dimensionally stacked nonvolatile memory devices have been developed. In the three-dimensionally stacked nonvolatile memory device, memory cells are three-dimensionally stacked in order to achieve high integration of the semiconductor memory device. The three-dimensionally stacked nonvolatile memory device includes a stacked body that is formed around a memory hole by stacking insulating films and conductive films. To increase the degree of integration of a memory device, it is desired to increase the number of stacked layers by thinning the insulating films and the conductive films of the stacked body. Use of a high-melting point metal, such as tungsten (W) or molybdenum (Mo), for the conductive film is under study. In view of these circumstances, to form such a conductive film by, e.g., a chemical vapor deposition (CVD) method, lowering resistance of a thinned conductive film is desired.

Examples of related art include U.S. Pat. Nos. 5,366,590 and 7,794,616.

DETAILED DESCRIPTION

At least one embodiment provides a semiconductor device including a conductive film using a high-melting point metal with lowered resistance, a semiconductor device manufacturing method, and a semiconductor device manufacturing apparatus.

In general, according to at least one embodiment, a semiconductor device includes a conductive film containing molybdenum and a metal element, the metal element having a melting point lower than the melting point of molybdenum. The metal element forms a complete solid solution with molybdenum.

Hereinafter, embodiments of a semiconductor device, a semiconductor device manufacturing method, and a semiconductor device manufacturing apparatus will be described with reference to the drawings. It is noted that substantially the same constitutional parts are denoted by the same reference signs and descriptions thereof may be partially omitted in each embodiment. The drawings are schematic, and a relationship between a thickness and a plane dimension, a ratio of thickness of parts, and other relationships may differ from actual values.

Semiconductor Device

Figure 1:
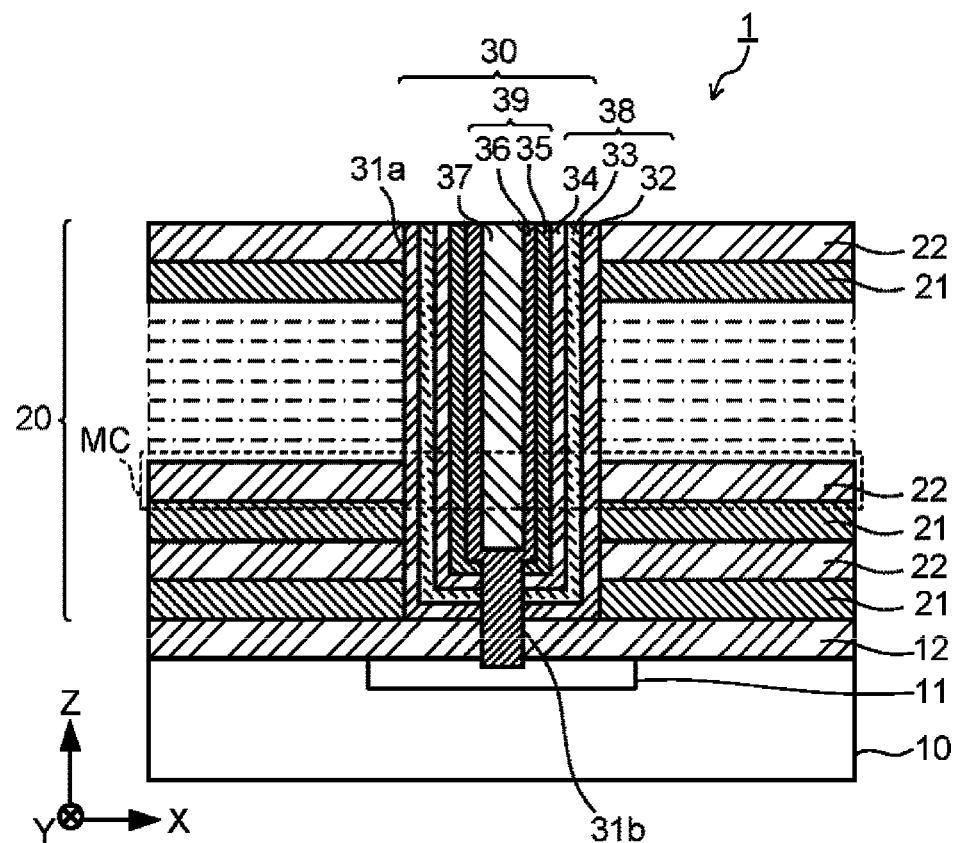
FIG. 1 is a sectional view showing a semiconductor device according to at least one embodiment.

A semiconductor device of at least one embodiment is, for example, a semiconductor storage device having a memory cell array. FIG. 1 is a sectional view showing a memory cell of a semiconductor device 1 of at least one embodiment. The semiconductor device 1 shown in FIG. 1 includes a semiconductor substrate 10, a stacked body 20 provided above the semiconductor substrate 10, and a columnar part 30 extending along the stacked direction of the stacked body 20. In FIG. 1, two directions that are orthogonal to each other while being parallel to a main surface of the semiconductor substrate 10 are respectively defined as an X direction and a Y direction, and a direction intersecting both of these X direction and Y direction is defined as a Z direction, which is the stacked direction.

The semiconductor substrate 10 includes a diffusion layer 11 that is to be coupled to a select transistor. The stacked body 20 is provided above the semiconductor substrate 10 having the diffusion layer 11, via an interlayer insulating film 12. The stacked body 20 includes multiple conductive films 21 and multiple insulating films 22. These conductive films 21 and insulating films 22 are alternately stacked in the Z direction. As detailed later, a molybdenum (Mo) alloy film having a film thickness of approximately 30 nm is used as the conductive film 21. A silicon oxide film having a film thickness of approximately 30 nm is used as the insulating film 22.

Although details are described later, the conductive film 21 is formed as follows: silicon oxide films as the insulating films 22 and silicon nitride films are alternately stacked, the silicon nitride films are then selectively etched to form spaces, and these spaces are filled with Mo alloy by, e.g., a CVD method. Herein, the chemical vapor deposition (CVD) method includes not only commonly used methods such as a metal organic (MO) CVD method and a plasma CVD method, but also an atomic layer deposition (ALD) method.

The columnar part 30 penetrates through the stacked body 20 in the Z direction and has an outer circumferential part 31a. The columnar part 30 is formed in such a manner as to reach the diffusion layer 11, which is provided in the semiconductor substrate 10. The columnar part 30 has a metal-oxide-nitride-oxide-silicon (MONOS) structure. Specifically, an alumina film as a block insulating film 32, a silicon nitride film as an electric charge storage film 33, a silicon oxide film as a tunnel insulating film 34, and a silicon film as a channel film 35 are formed in order from the stacked body 20 side, along the outer circumferential surface 31a of the columnar part 30.

A silicon film 36 is formed inside the channel film 35, and a silicon oxide film is formed inside the silicon film 36 as an insulating film 37. The silicon film 36 has a protrusion 31b that extends in the Z direction, in order to electrically connect the channel film 35 to the diffusion layer 11. The block insulating film 32, the electric charge storage film 33, and the tunnel insulating film 34 constitute a memory film 38. The channel film 35 and the silicon film 36 constitute a semiconductor film 39.

The conductive films 21, the memory film 38, and the semiconductor film 39 constitute multiple memory cells MC arranged in the Z direction. The memory cell MC has a vertical transistor structure with the conductive film 21 surrounding the semiconductor film 39 via the memory film 38. The semiconductor film 39 functions as a channel of the memory cell MC having the vertical transistor structure. The conductive film 21 functions as a control gate or a control electrode. The electric charge storage film 33 functions as a data storage layer that stores electric charges injected from the semiconductor film 39.

The conductive film 21 of the stacked body 20 is made of Mo alloy, as described above. The Mo alloy that is used in the conductive film 21 contains Mo and a metal element, which may be hereinafter described as an "M element". Herein, the metal element M is an element having a melting point lower than that of Mo and forming a complete solid solution with Mo. At least one selected from the group consisting of titanium (Ti), vanadium (V), and niobium (Nb) is used as such a metal element or an M element. The M element is contained preferably in an amount of 5 atomic % or less, or more preferably, in an amount of 1 atomic % or less, with respect to the total amount of Mo and the M element. It is noted that the complete solid solution is a solid solution containing two kinds of metal elements that are meltable at any composition in each of a liquid phase and a solid phase.

In the semiconductor device or three-dimensionally stacked nonvolatile memory device 1 having the memory cell MC with the vertical transistor structure, it is effective to increase the number of stacked layers of the conductive films 21 and the insulating films 22, in order to increase the degree of integration. As the number of stacked layers increases, the stacked thickness of the stacked body 20 increases. In view of this, thinning the conductive film 21 is desired in order to reduce dimensions and thickness of the semiconductor device 1 as a device. However, decreasing the film thickness of the conductive film 21 causes increase in resistance, and therefore, a conductive material with low resistivity is preferably used. An existing memory cell MC uses tungsten (W) or molybdenum (Mo) for the conductive film. Mo is a material having a resistivity lower than that of W and exhibiting low resistance when in the form of a thin film. However, Mo is a high-melting point metal as in the case of W, and thus, crystallization does not sufficiently progress in a forming temperature range of 400 to 800° C. in forming using, e.g., a CVD method. As a result, the grain size tends to be small, and a thin film of, for example, 30 nm or less, has a high resistivity.

It is effective to lower the melting point of a material in order to accelerate crystallization and increase a grain size. For these reasons, in the semiconductor device 1 of at least one embodiment, at least one M element selected from the group consisting of Ti, V, and Nb is added to Mo, as a metal element having a melting point lower than that of Mo, whereby the melting point of the Mo alloy as a material for composing the conductive film 21 is lowered. Moreover, each of Ti, V, and Nb, which forms a complete solid solution with Mo, does not cause phase separation of the Mo alloy and reduces electron scattering and other undesirable phenomenon due to precipitates.

As shown in a Mo—Ti phase diagram, a Mo—V phase diagram, and a Mo—Nb phase diagram in Desk Handbook "Phase Diagram for Binary Alloys", the second edition (ASM Handbooks 2010 Dec. 15), it is clear that an alloy that is made by adding a M element to Mo forms a complete solid solution and has a melting point lowered by the added M element. Thus, the added element, that is, the M element, prevents increase in electric resistance of the conductive film 21. Moreover, Ti, V, or Nb forms an alloy layer without generating a hetero phase, whereby lowering of the melting point of Mo can be freely designed.

Addition of at least one element of Ti, V, and Nb to Mo lowers the melting point. The grain size increases with increase in the addition amount in a forming temperature range of 300 to 700° C. of the Mo alloy. On the other hand, Mo has a resistivity of 53.4 nOhm·m, whereas each of Ti, V, and Nb has a resistivity higher than that of Mo such that Ti has a resistivity of 420 nOhm·m, V has a resistivity of 197 nOhm·m, and Nb has a resistivity of 152 nOhm·m. Thus, the resistivity of the Mo alloy rises as the concentration of Ti, V, or Nb increases. This contrary effect tends to cause a rise in resistivity when the concentration of Ti, V, or Nb exceeds a certain degree, although the resistivity is once decreased with increase in grain size due to addition of Ti, V, or Nb to Mo.

For example, the resistivity of the Mo alloy is lower than that of Mo in an amount of 100% when the amount of V added to Mo is 5 atomic %, but the resistivity is close to that of Mo in an amount of 100% when the addition amount of V is 30%. From this point of view, the amount of V added to Mo is preferably 5 atomic % or less. This also applies to Ti and Nb, and the addition amount of each of Ti and Nb is preferably 5 atomic % or less. Also when two or more elements selected from among Ti, V, and Nb are added to Mo, the total addition amount is preferably 5 atomic % or less. Moreover, the amount of the M element added to Mo is more preferably 1 atomic % or less. The lower limit of the addition amount of the M element is not specifically limited. For example, on the condition that the M element in the amount able to be detected by atom probe is contained, the effect for lowering the melting point is obtained in accordance with the addition amount, whereby the effect for increasing the grain size and the effect for reducing the resistivity are obtained accordingly.

Figure 2:
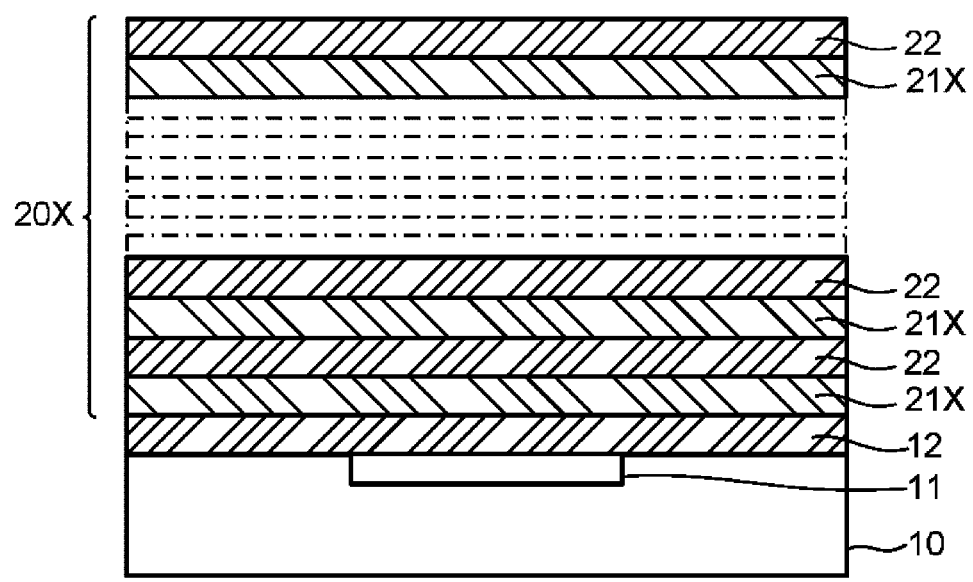
FIG. 2 is a sectional view showing a manufacturing process of the semiconductor device of at least one embodiment.
Figure 3:
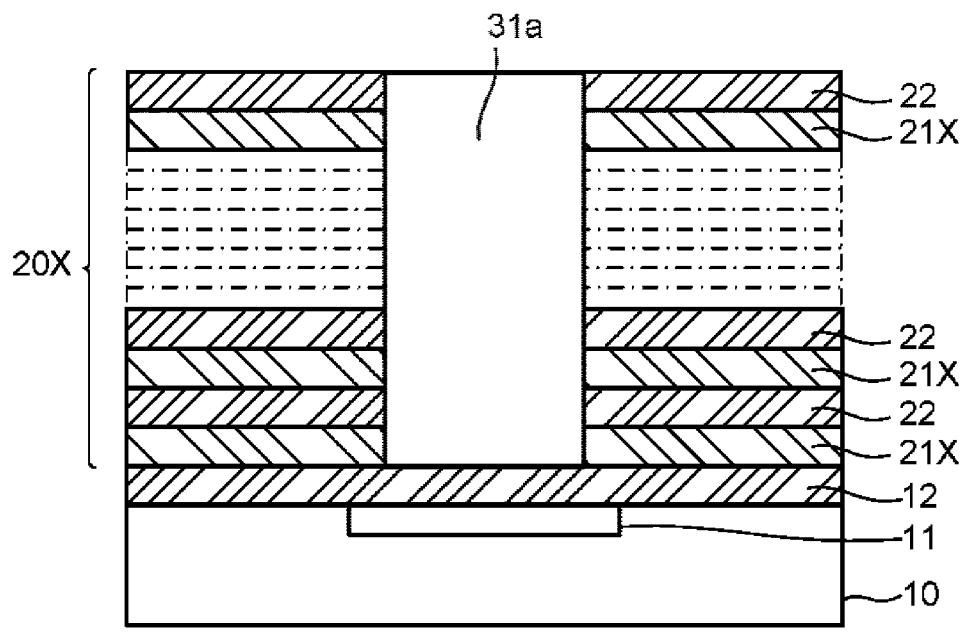
FIG. 3 is a sectional view showing the manufacturing process of the semiconductor device of at least one embodiment.

Semiconductor Device Manufacturing Method and Semiconductor Device Manufacturing Apparatus Next, a method for manufacturing the semiconductor device 1 of the embodiment will be described with reference to FIGS. 2 to 10. First, as shown in FIG. 2, silicon nitride films 21X and silicon oxide films 22 having a film thickness of approximately 30 nm as insulating films 22 are alternately deposited above a semiconductor substrate 10 having a diffusion layer 11, via an interlayer insulating film 12, by a CVD method, whereby a stacked body 20X is formed. In one example, 24 layers of the silicon nitride films 21X and 24 layers of the insulating films 22 are deposited. Next, as shown in FIG. 3, a memory hole 31a is formed in the stacked body 20X in the stacked direction, which is the Z direction, by using a lithography method. The diameter of the memory hole 31a is, for example, 80 nm.

Figure 4:
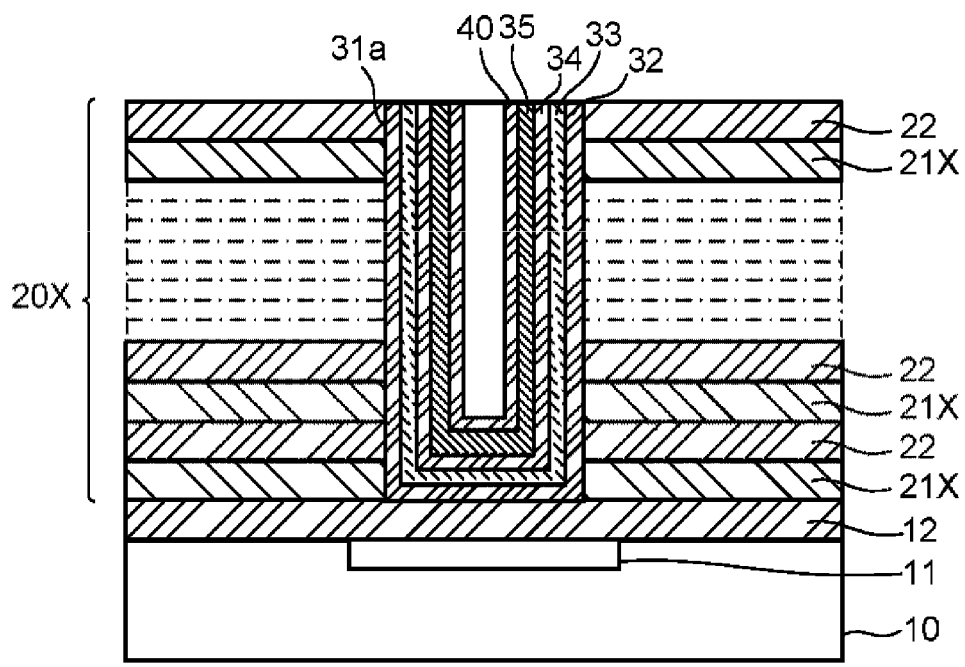
FIG. 4 is a sectional view showing the manufacturing process of the semiconductor device of at least one embodiment.

Then, as shown in FIG. 4, an aluminum oxide film as a block insulating film 32, a silicon nitride film as an electric charge storage film 33, a silicon oxide film as a tunnel insulating film 34, a polysilicon film as a channel film 35, and a silicon oxide film as a side wall film 40 are sequentially deposited in the memory hole 31a.

Figure 5:
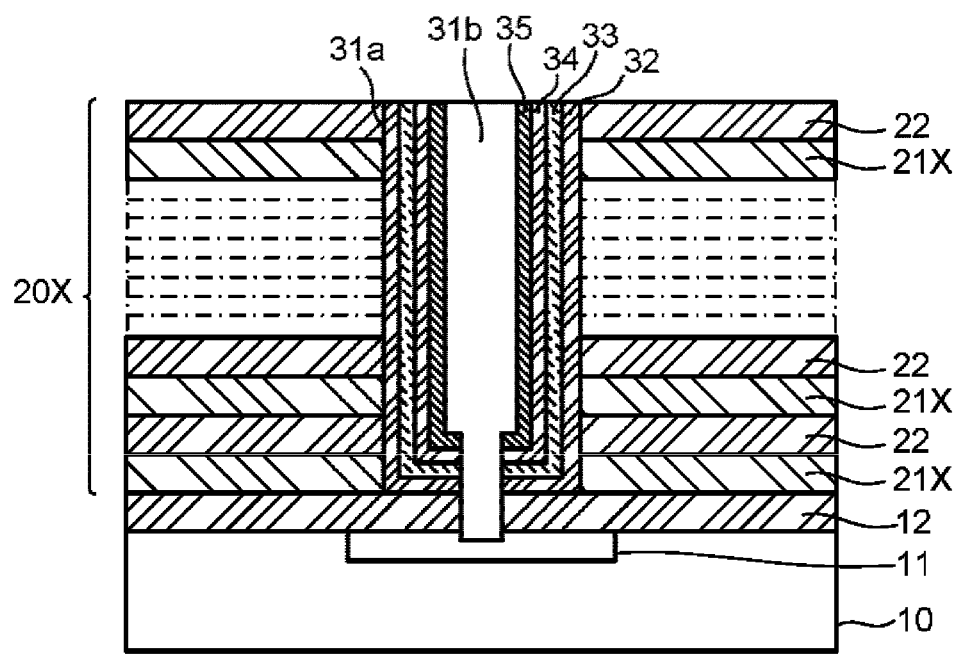
FIG. 5 is a sectional view showing the manufacturing process of the semiconductor device of at least one embodiment.
Figure 6:
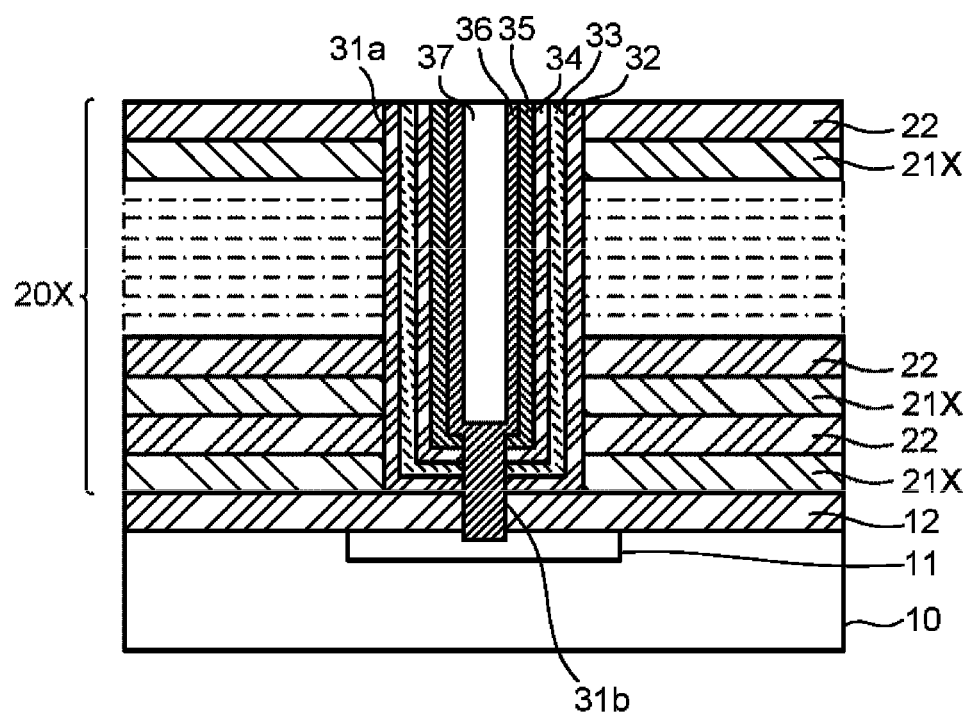
FIG. 6 is a sectional view showing the manufacturing process of the semiconductor device of at least one embodiment.
Figure 7:
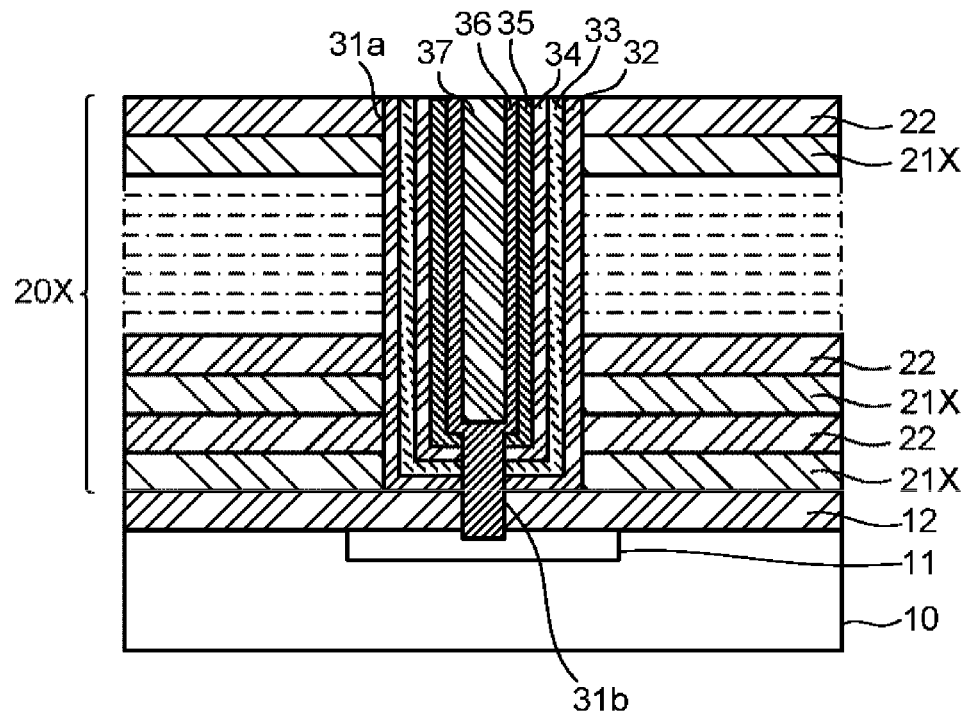
FIG. 7 is a sectional view showing the manufacturing process of the semiconductor device of at least one embodiment.

As shown in FIG. 5, a lower part of each of the films 32, 33, 34, and 35 and the interlayer insulating film 12 may be etched by a reactive ion etching (RIE) method while the side wall film 40 is used as a mask, whereby the diffusion layer 11 is exposed. Subsequently, the side wall film 40 as the mask may be etched by selective RIE to expose the channel film 35, which is the polysilicon film. As shown in FIG. 6, a polysilicon film 36 is deposited along an inner wall of the channel film 35, whereby the channel film 35 is electrically connected to the diffusion layer 11. Then, as shown in FIG. 7, a silicon oxide film is embedded in a hole inside the polysilicon film 36, as an insulating film 37.

Figure 8:
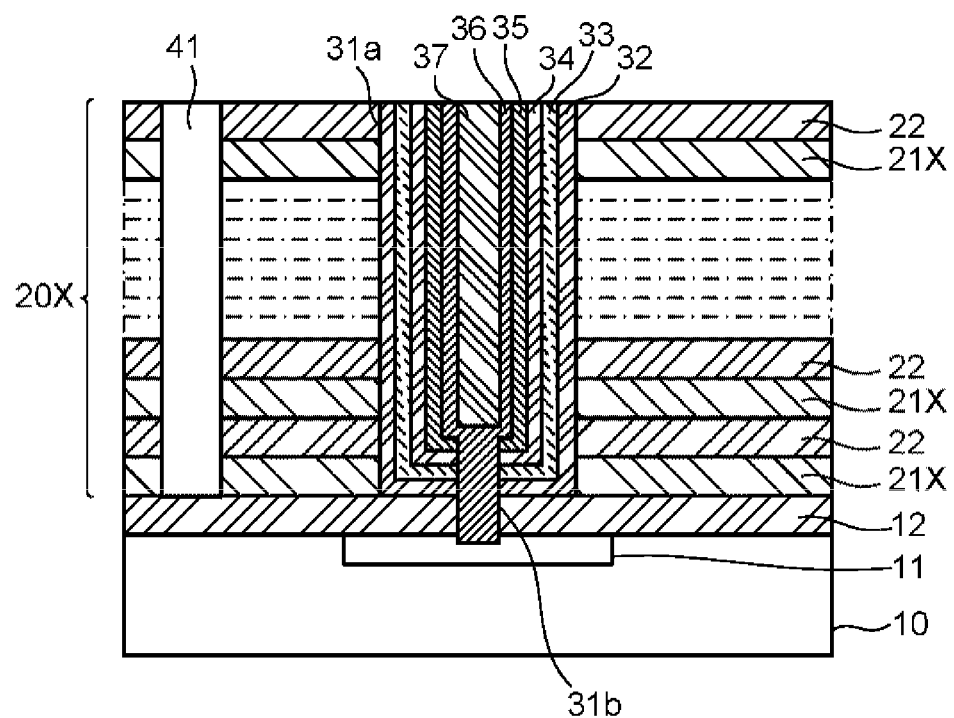
FIG. 8 is a sectional view showing the manufacturing process of the semiconductor device of at least one embodiment.
Figure 9:
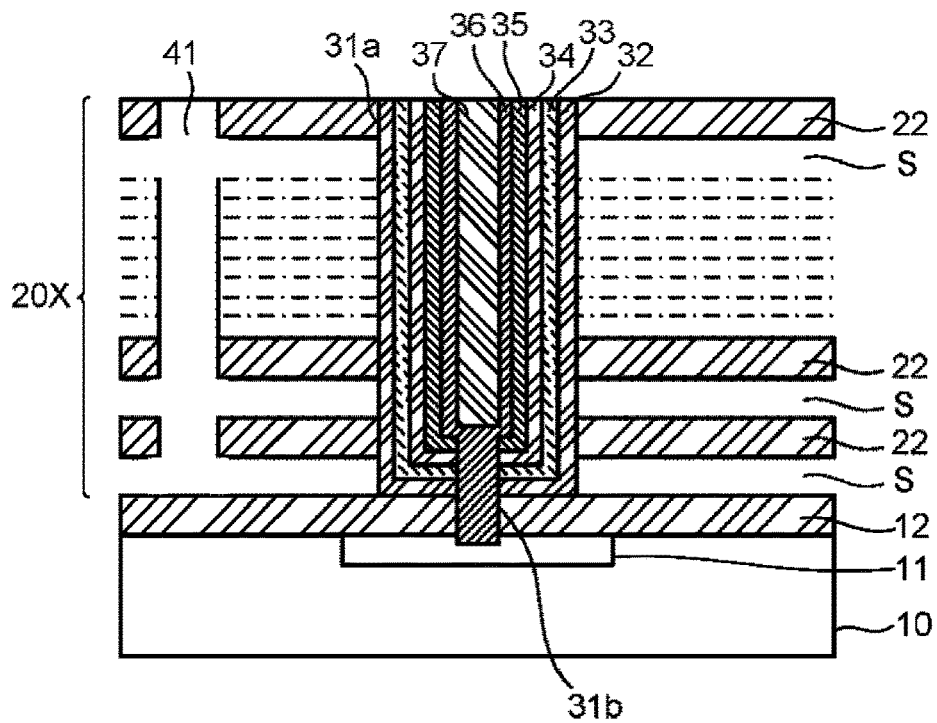
FIG. 9 is a sectional view showing the manufacturing process of the semiconductor device of at least one embodiment.
Figure 10:
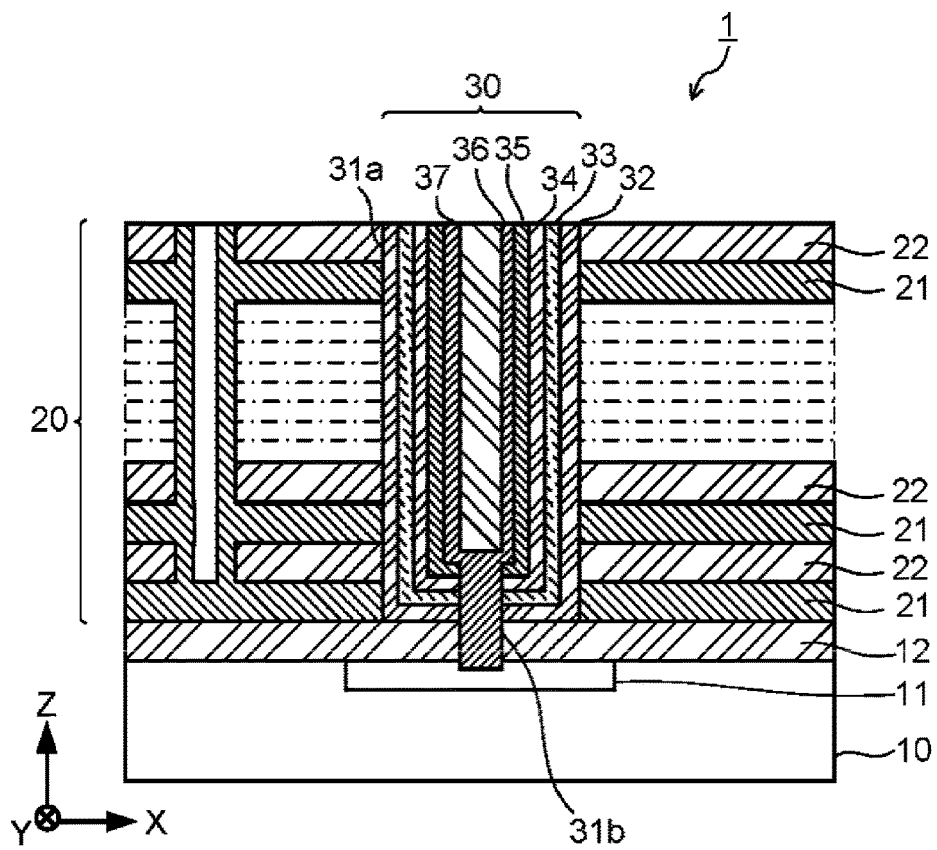
FIG. 10 is a sectional view showing the manufacturing process of the semiconductor device of at least one embodiment.

Next, as shown in FIG. 8, a slit 41 is formed in the stacked body 20X by using a lithography method and an RIE method. As shown in FIG. 9, the silicon nitride films 21X are etched through the slit 41 by phosphoric acid that is heated to 150° C., to form spaces S for forming conductive films 21. As shown in FIG. 10, these spaces are filled with Mo alloy by, e.g., a CVD method, to form the conductive films 21, whereby a stacked body 20 is obtained. Then, after the Mo alloy at a region that does not need the Mo alloy is removed, and a silicon oxide film is embedded thereat, and upper wiring and other members, which are not shown in the drawing, are formed. Thus, a semiconductor device or a three-dimensionally stacked nonvolatile memory device 1 is manufactured. The process for forming the Mo alloy is detailed below.

A MoV alloy is formed by, for example, a CVD method. First, (1) a Mo film is deposited by using $MoF_6$ and $H_2$, and (2) a V film is deposited by using $VCl_4$ and $H_2$. Thereafter, the film deposition process (1) for the Mo film and the film deposition process (2) for the V film are repeated. Then, a heat treatment is performed in an Ar atmosphere, whereby a MoV alloy is formed. Thus, the MoV alloy is embedded in the space S of the stacked body.

A method of forming the MoV alloy by using a mixed gas of $MoCl_5$ and $VCl_4$ and $H_2$ may be performed instead of the deposition method described above. A condition for supplying $MoCl_5$ and $VCl_4$ at a partial pressure ratio ($P_{Mo}/P_V$) of 10 to 100 is employed, and the mixed gas of $MoCl_5$ and $VCl_4$ and $H_2$ are alternately supplied to a reaction furnace to form the MoV alloy. The MoV alloy may be formed by supplying $MoCl_5$, $VCl_4$, and $H_2$ at the same time, depending on the shape of the space S. Instead of fluorides and chlorides, other halides, carbonyl compounds, amino compounds, etc., may also be used as raw materials of Mo and V.

In a case of using a MoNb alloy as the Mo alloy, the MoNb alloy is formed by, for example, a CVD method, as follows. (1) A Mo film is deposited by using $MoF_6$ and $H_2$, and then, (2) a Nb film is deposited by using $NbCl_5$ and $H_2$. Thereafter, the film deposition process (1) for the Mo film and the film deposition process (2) for the Nb film are repeated multiple times. Then, a heat treatment is performed in an Ar atmosphere, whereby a MoNb alloy is formed. Alternatively, the MoNb alloy may be formed by using a mixed gas of $MoCl_5$ and $NbCl_5$ and $H_2$. In this case, adjustment is performed so that a partial pressure ratio ($P_{Mo}/P_{Nb}$) of $MoCl_5$ and $NbCl_5$ will be 10 to 100. In addition, halides other than those described above, carbonyl compounds, amino compounds, etc., may also be used as raw materials of Mo and Nb. For example, $Mo(CO)_6$ may be used instead of $MoF_6$ or $MoCl_5$.

In a case of using a MoTi alloy as the Mo alloy, the MoTi alloy is formed by, for example, a CVD method, as follows. (1) A Mo film is deposited by using $MoF_6$ and $H_2$, and then, (2) a Ti film is deposited by using $TiCl_4$ and $H_2$. Thereafter, the film deposition process (1) for the Mo film and the film deposition process (2) for the Ti film are repeated multiple times. Then, a heat treatment is performed in an Ar atmosphere, whereby a MoTi alloy is formed. Alternatively, the MoTi alloy may be formed by using a mixed gas of $MoCl_5$ and $TiCl_4$ and $H_2$. In this case, $MoCl_5$ and $TiCl_4$ are supplied by adjusting a partial pressure ratio ($P_{Mo}/P_{Ti}$) to 10 to 100, and the MoTi alloy is formed by using a reaction with $H_2$. A compound containing Si, such as $SiH_4$, or a compound containing P, such as $PH_3$, may be used in addition to $H_2$. This compound may be added to $H_2$ in order to reduce $MoCl_5$ and $TiCl_4$, whereby the MoTi alloy may be formed. In addition, halides other than those described above, carbonyl compounds, amino compounds, etc., may also be used as raw materials of Mo and Ti.

Figure 11:
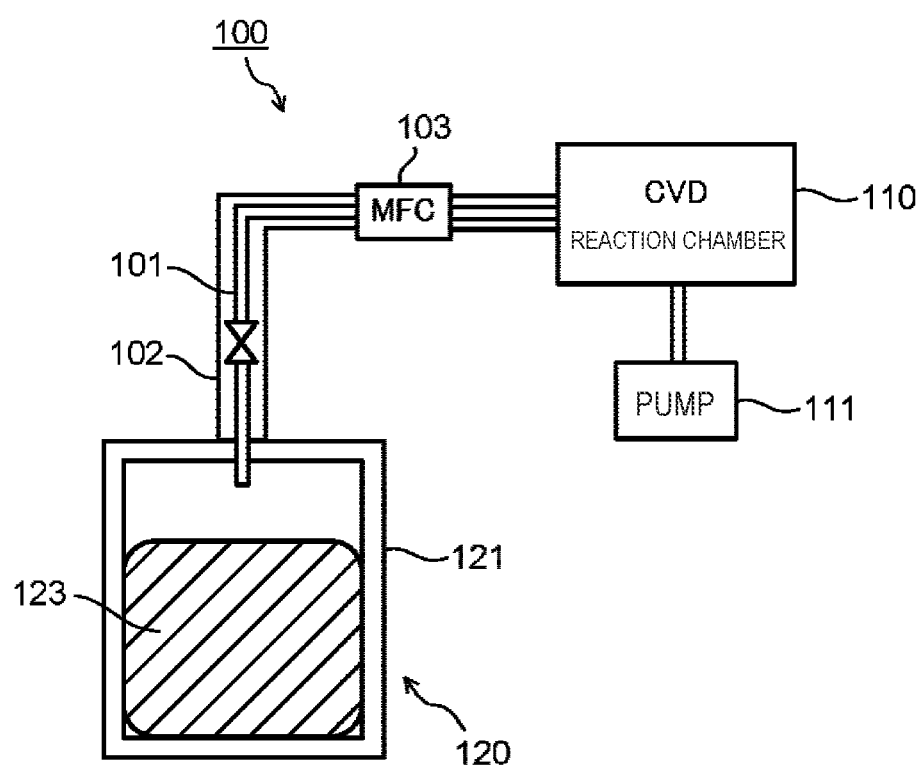
FIG. 11 shows a schematic configuration of a semiconductor device manufacturing apparatus of at least one embodiment.

In the methods described above, for example, $MoCl_5$, $NbCl_5$, $VCl_4$, and $Mo(CO)_6$ are supplied in a solid state to a raw material supply part 120. In the case of using such a solid raw material, the following film deposition apparatus is preferably used as a semiconductor device manufacturing apparatus. FIG. 11 shows a schematic configuration of a film deposition apparatus employing a CVD method. A film deposition apparatus 100 includes a film deposition chamber 110 and the raw material supply part 120. The film deposition chamber 110 and the raw material supply part 120 are coupled via a gas supply pipe 101. A heater 102 is provided around the gas supply pipe 101 so as to prevent solidification of raw material gas that is gasified in the raw material supply part 120. The gas supply pipe 101 is provided with a gas flow controller or MFC 103 that adjusts a flow rate of the raw material gas and then sends the raw material gas to the film deposition chamber 110. The film deposition chamber 110 has a pump 111 so that the pressure in the film deposition chamber 110 can be controlled to a predetermined pressure. Although not shown in the drawing, the film deposition chamber 110 has a holding table for a substrate, an electrode, a power source, and other components.

Figure 12A:
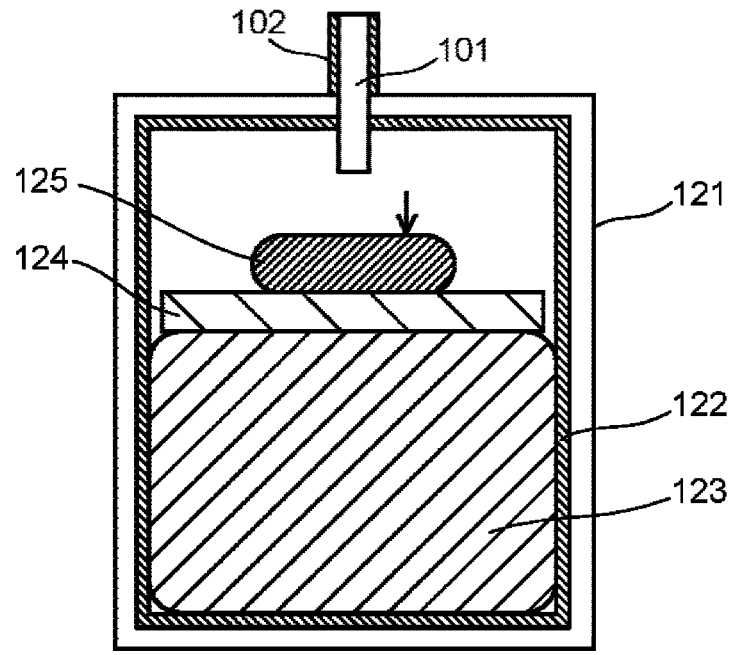
FIGS. 12A and 12B are sectional views showing an example of a primary part of the semiconductor device manufacturing apparatus shown in FIG. 11.
Figure 12B:
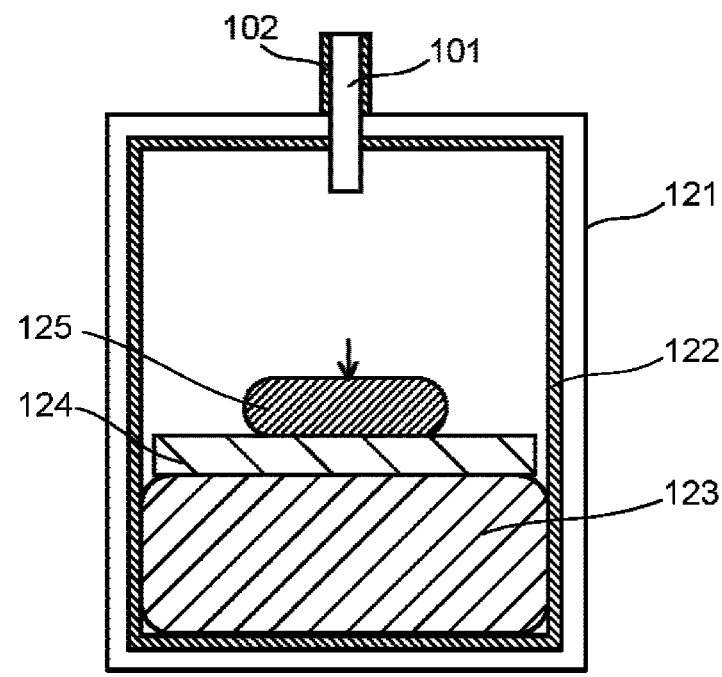
Figure 13:
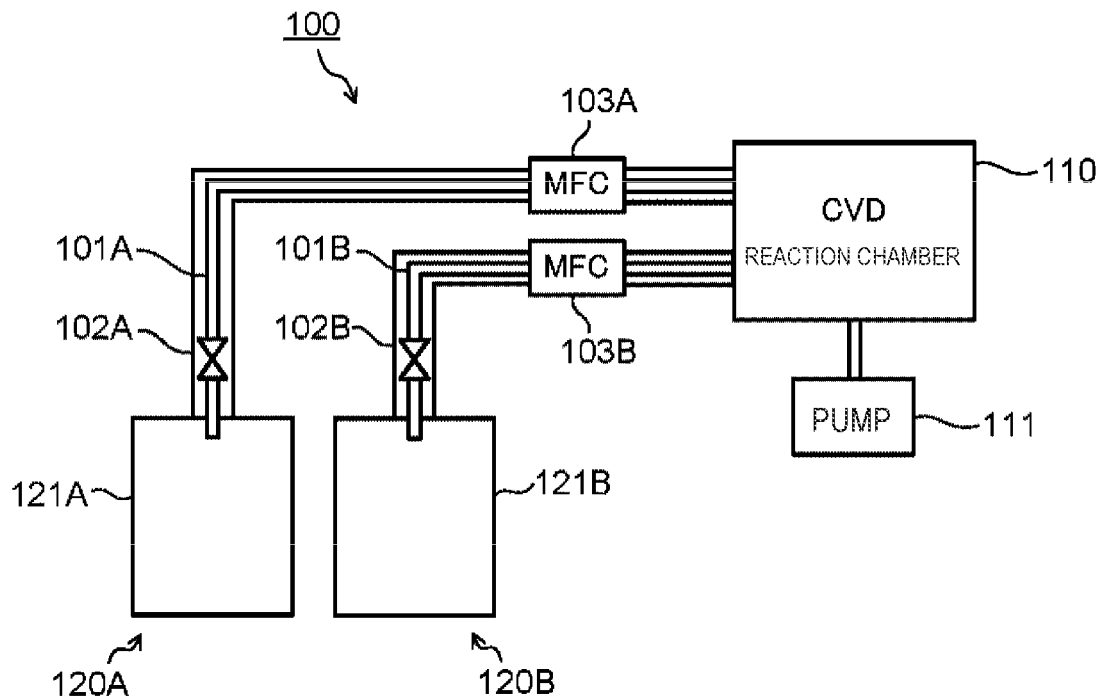
FIG. 13 shows another configuration of the semiconductor device manufacturing apparatus of at least one embodiment.
Figure 14:
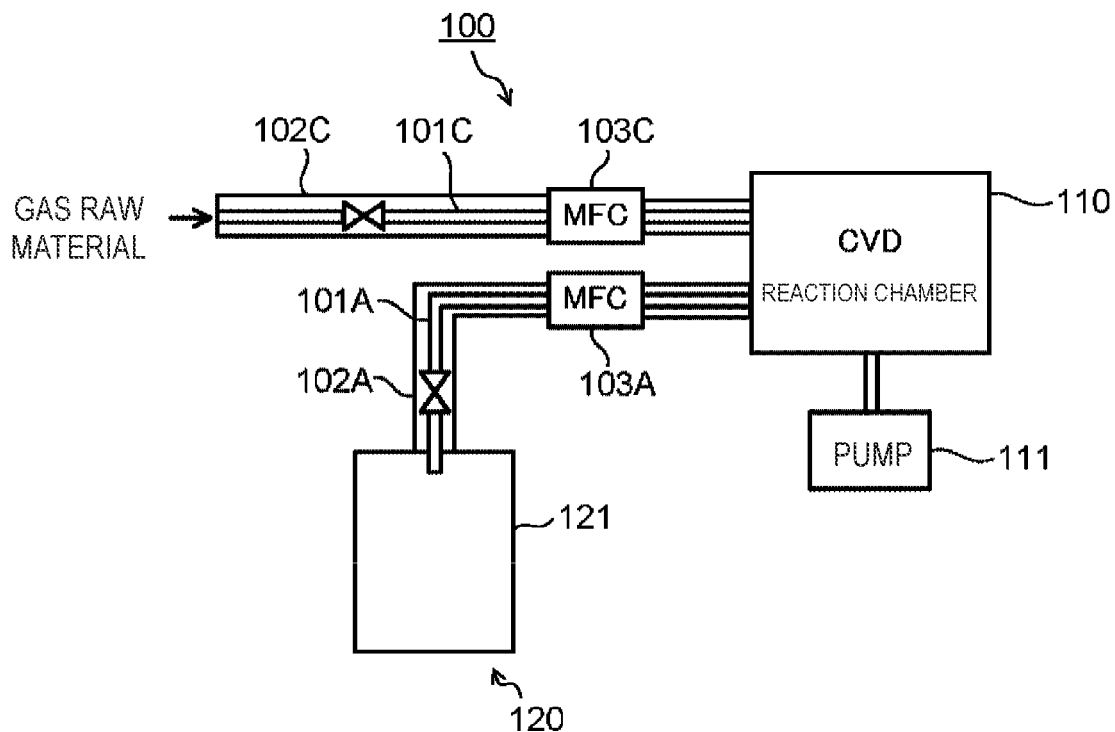
FIG. 14 shows yet another configuration of the semiconductor device manufacturing apparatus of at least one embodiment.

The raw material supply part 120 has a raw material container 121. The raw material container 121 has a heater 122 that is provided along an inner wall, as shown in FIGS. 12A and 12B. The heater 122 is configured to be able to heat a lower part, an upper part, and a middle part of the raw material container 121 to different temperatures. In one example, the lower part of the raw material container 121 is heated to 150° C., the middle part of the raw material container 121 is heated to 130° C., and the upper part of the raw material container 121 is heated to 160° C. The upper part of the raw material container 121 is coupled to an end of the gas supply pipe 101. Among raw materials of films to be deposited by a CVD method, a solid raw material 123 is placed in the raw material container 121. In the case of depositing the MoV alloy of the foregoing embodiment by the film deposition apparatus 100, $MoCl_5$ or $VCl_4$ is placed in the raw material container 121, as the solid raw material 123. The raw material of the M element may be placed in a raw material container 121 that is different from the raw material container 121 for a raw material of Mo or may be placed in the raw material container 121 for the raw material of Mo, in accordance with the film deposition process. Specifically, although FIG. 11 shows only one raw material container 121, in the case of placing the raw material of Mo and the raw material of the M element in different raw material containers, a first raw material container 121A and a second raw material container 121B are used, as shown in FIG. 13. The first raw material container 121A contains a solid raw material of Mo. The second raw material container 121B contains a solid raw material of the M element. In the case of placing the raw material of Mo and the raw material of the M element in the same raw material container, one raw material container 121 containing the solid raw material of Mo and the solid raw material of the M element is used. A raw material except for the solid raw material, such as a gas raw material, is supplied to the film deposition chamber 110 through another supply pipe 101C, as shown in FIG. 14.

The solid raw material 123 that is placed in the raw material container 121 is heated by the heater 122 to be sublimated, and the vaporized component is sent to the film deposition chamber 110 as a raw material gas. As the volume of the solid raw material 123 is decreased by heating, the surface area of the solid raw material 123 varies, and the heat may be barely transmitted from the heater 122 to the solid raw material 123. This causes unstable supply of the raw material gas from the solid raw material 123. This feature of the solid raw material 123 greatly differs from that of a liquid raw material. The heat transmission from the heater 122 is uniform even when gasification of a liquid raw material advances, whereas the heat transmission from the heater 122 may become not uniform as gasification of a solid raw material advances. In consideration of this, the film deposition apparatus 100 of at least one embodiment has a movable plate-shaped lid 124 and a weight 125. The lid 124 is configured to be put directly on a top of the solid raw material 123. The weight 125 is configured to apply a load to the solid raw material 123 via the lid 124. The weight 125 functions as a mechanism for applying a load to the solid raw material 123. Each of the lid 124 and the weight 125 uses, for example, stainless steel (SUS), or corrosion-resistant nickel alloy, such as Hastelloy or Inconel.

Specifically, as shown in FIG. 12A, the lid 124 is put on the top of the solid raw material 123 that is placed in the raw material container 121, and the weight 125 is also put on the lid 124 to apply a load to the solid raw material 123. The solid raw material 123 is contained in the raw material container 121 in the form of, for example, powder. In these conditions, the heater 122 is operated to heat the solid raw material 123, thereby vaporizing the solid raw material 123. At this time, the heater 122 may perform heating while generating a temperature distribution in such a manner that a bottom part of the raw material container 121 is heated to have a temperature higher than that of the middle part of the raw material container 121. The vaporized component of the solid raw material 123 is introduced into the film deposition chamber 110 via the gas supply pipe 101. The amount of introduction of the vaporized component to the film deposition chamber 110 is controlled by the gas flow controller 103. While the vaporization of the solid raw material 123 advances, and the volume of the solid raw material 123 decreases, the solid raw material 123 is applied with a load by the weight 125 via the lid 124, as shown in FIG. 12B. This enables securing a contact area between the solid raw material 123 and the heater 122, whereby heat can be uniformly transmitted to the solid raw material 123. Thus, vaporization of the solid raw material 123 is stably performed. As described above, the film deposition apparatus 100 of the embodiment enables stably performing film deposition using the solid raw material 123, for example, film deposition of a Mo alloy using a solid raw material of the Mo alloy.

Figure 15:
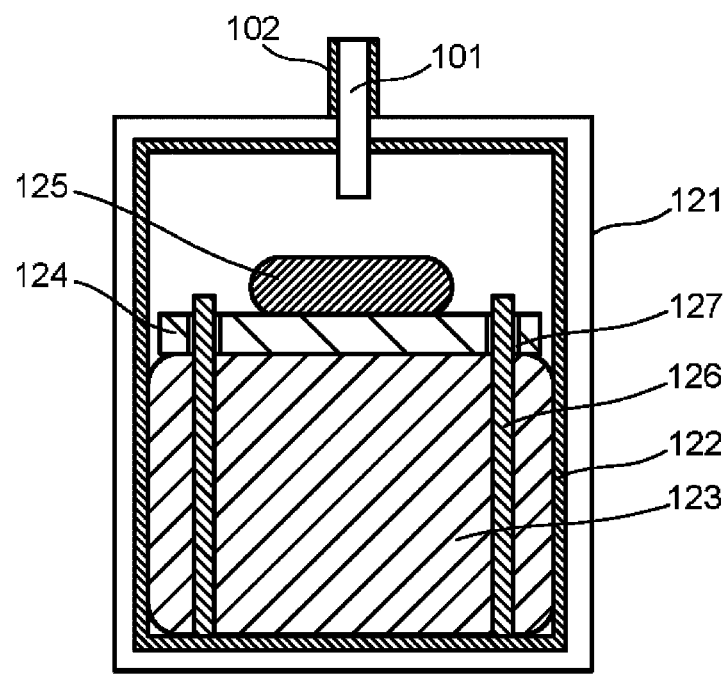
FIG. 15 is a sectional view showing another example of the primary part of the semiconductor device manufacturing apparatus shown in FIG. 11.
Figure 16:
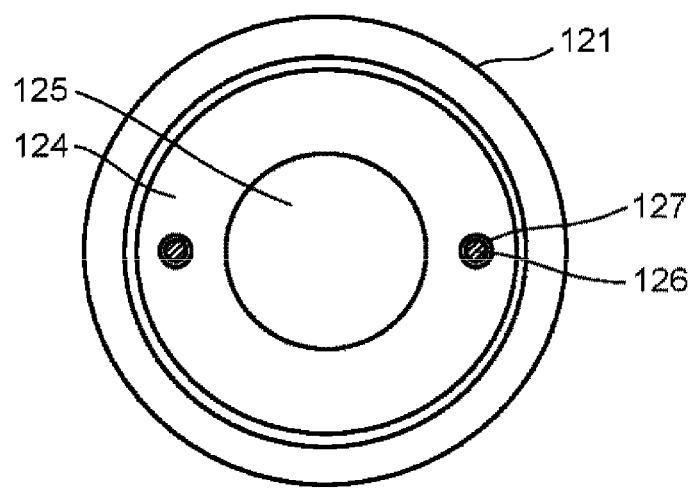
FIG. 16 is a view of the primary part of the semiconductor device manufacturing apparatus shown in FIG. 15, as viewed through an upper surface.

As shown in FIGS. 15 and 16, the raw material container 121 may have a guide bar 126 as a guide member, in order to stabilize the contact state of the lid 124 to the solid raw material 123. In using the guide bar 126, a through hole 127 for inserting the guide bar 126 is provided in the lid 124. That is, movement of the lid 124 is limited by the guide bar 126 so that the lid 124 will be prevented from deviating from the placed position in accordance with decrease in volume of the solid raw material 123. Thus, movement of the lid 124 in accordance with decrease in volume of the solid raw material 123 is guided by the guide bar 126, whereby the contact state of the lid 124 to the solid raw material 123 and the state of applying a load to the solid raw material 123 via the lid 124 by the weight 125 can be further stabilized. As a result, deposition is more stably performed by using the solid raw material 123.

Figure 17:
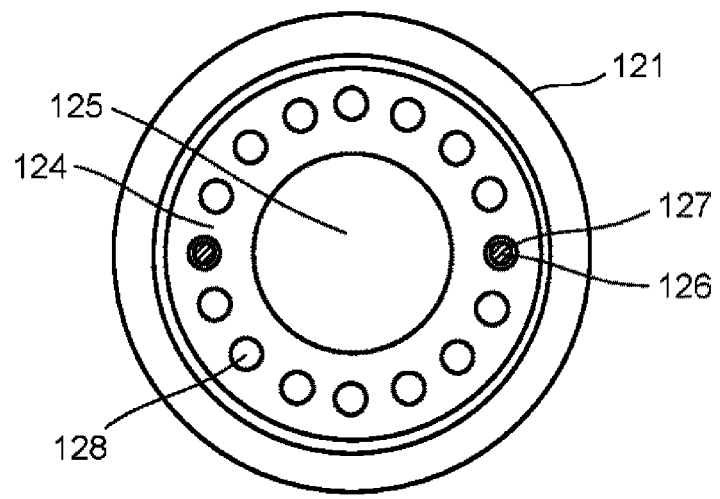
FIG. 17 is a view of another example of the primary part of the semiconductor device manufacturing apparatus shown in FIG. 11, as viewed through an upper surface.
Figure 18:
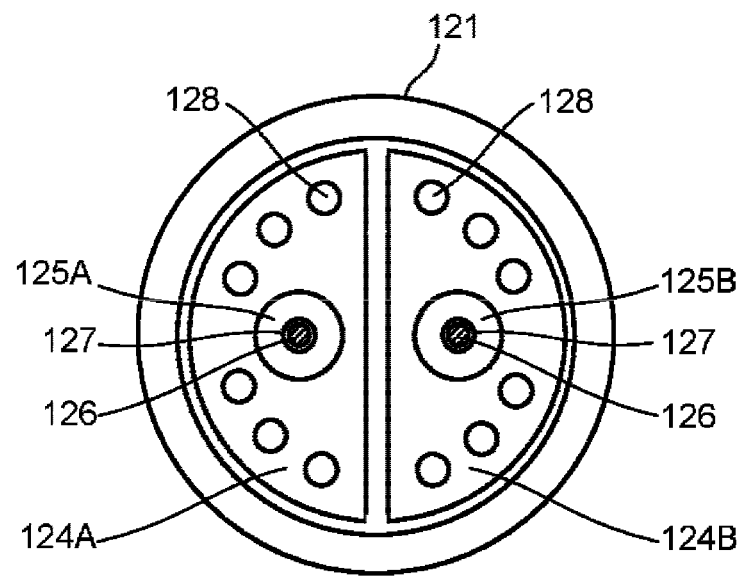
FIG. 18 is a view of yet another example of the primary part of the semiconductor device manufacturing apparatus shown in FIG. 11, as viewed through the upper surface.

Moreover, to send the vaporized component of the solid raw material 123, which is generated by heating, to the gas supply pipe 101, the lid 124 may be provided with a through hole 128 for allowing the vaporized component to pass through, as shown in FIG. 17. This enables the vaporized component of the solid raw material 123 under the lid 124 to be efficiently sent to the gas supply pipe 101 via the through hole 128 of the lid 124. The through hole 128 for allowing the vaporized component to pass through may also be provided to the weight 125. The lid 124 and the weight 125 that are able to apply loads to the solid raw material 123 may be variously modified. In one example, as shown in FIG. 18, lids 124A and 124B that are multiple separated parts may be used. In this case, weights 125A and 125B are respectively put on the lids 124A and 124B. The mechanism for applying a load to the solid raw material 123 via the lid 124 is not limited to the weight 125 and may be, e.g., an elastic body such as a spring.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor device, comprising:

placing a substrate into a chamber;

forming, on the substrate, a conductive film containing molybdenum and a metal element by a chemical vapor deposition (CVD) method, the metal element having a melting point lower than the melting point of molybdenum, and the metal element forming a complete solid solution with molybdenum, wherein the metal element is at least one selected from the group consisting of vanadium and niobium;

wherein the formation of the conductive film includes:

supplying a first solid raw material in a solid state, the first raw material containing molybdenum;

supplying a second solid raw material in a solid state, the second raw material containing the metal element;

generating a raw material gas by gasifying the first solid raw material and the second solid raw material;

forming the conductive film by the raw material gas;

supplying the first solid raw material and the second solid raw material in a raw material container;

generating the raw material gas by gasifying the first solid raw material and the second solid raw material in the raw material container wherein the raw material container includes a first container and a second container different from the first container, the first container containing the first solid raw material and the second container containing the second solid raw material, and the formation of the conductive film further includes:

adjusting a partial pressure ratio of a gas generated from the first solid raw material and a gas generated from the second solid raw material, wherein the partial pressure ratio of the gas generated from the first solid raw material and the gas generated from the second solid raw material is adjusted to be 10 to 100.

2. The method for manufacturing the semiconductor device according to claim 1, comprising:

forming a stacked body having a plurality of the conductive films alternately stacked with insulating films; and forming a columnar part in a hole in the stacked body along a stacked direction of the stacked body, the columnar part having a semiconductor film and an electric charge storage film disposed between the semiconductor film and the plurality of the conductive films.

3. The method for manufacturing the semiconductor device according to claim 1, wherein the metal element is vanadium.

* * * * *